United States Patent
Ferrara et al.

(10) Patent No.: US 7,372,142 B2
(45) Date of Patent: May 13, 2008

(54) VERTICAL CONDUCTION POWER ELECTRONIC DEVICE PACKAGE AND CORRESPONDING ASSEMBLING METHOD

(75) Inventors: Maurizio Maria Ferrara, Catania (IT); Angelo Magri, Belpasso (IT); Agatino Minotti, Mascalucia (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 58 days.

(21) Appl. No.: 11/142,816

(22) Filed: May 31, 2005

(65) Prior Publication Data

US 2005/0275082 A1    Dec. 15, 2005

(30) Foreign Application Priority Data

May 31, 2004   (EP)  ................................. 04425399

(51) Int. Cl.
*H01L 23/52* (2006.01)
(52) U.S. Cl. ............ 257/691; 257/658; 257/673; 257/686; 257/677; 257/729; 257/678; 257/672; 257/676; 257/E23.044; 257/E23.031; 257/E23.001; 257/E23.034
(58) Field of Classification Search ............. 257/691, 257/658, 673, 686, 678, 729, 728, 731, 672, 257/676, E23.044, E23.001, E23.034
See application file for complete search history.

(56) References Cited

U.S. PATENT DOCUMENTS

| | | | | |
|---|---|---|---|---|
| 5,532,512 A | * | 7/1996 | Fillion et al. | ............... 257/686 |
| 6,774,466 B1 | * | 8/2004 | Kajiwara et al. | ........... 257/673 |
| 2002/0096748 A1 | | 7/2002 | Pavier | |
| 2003/0052405 A1 | | 3/2003 | Moriguchi | |

FOREIGN PATENT DOCUMENTS

| | | |
|---|---|---|
| DE | 19902462 | 8/2000 |
| EP | 0179714 | 4/1986 |
| EP | 1187204 A2 | 3/2002 |

OTHER PUBLICATIONS

European Search Report, EP04425399, Jan. 10, 2005.
MOSFET BGA Design Guide—Fairchild Semiconductor, Aug. 2002.

* cited by examiner

*Primary Examiner*—Junghwa M. Im
(74) *Attorney, Agent, or Firm*—Graybeal Jackson Haley LLP

(57) ABSTRACT

A vertical conduction power electronic device package and corresponding assembly method comprising at least a metal frame suitable to house at least a plate or first semiconductor die having at least a first and a second conduction terminal on respective opposed sides of the first die. The first conduction terminal being in contact with said metal frame and comprising at least an intermediate frame arranged in contact with said second conduction terminal.

20 Claims, 16 Drawing Sheets

| Assembly technology | Resistive contributions | | Thermal resistance to the heat loss |
|---|---|---|---|
| | Device-package connection | Current distribution on the device surface | |
| Standard | 2 mΩ | 1.5 mΩ | 10 °C/W |
| Bridge | 0.5 mΩ | 0.1 mΩ | 7 °C/W |

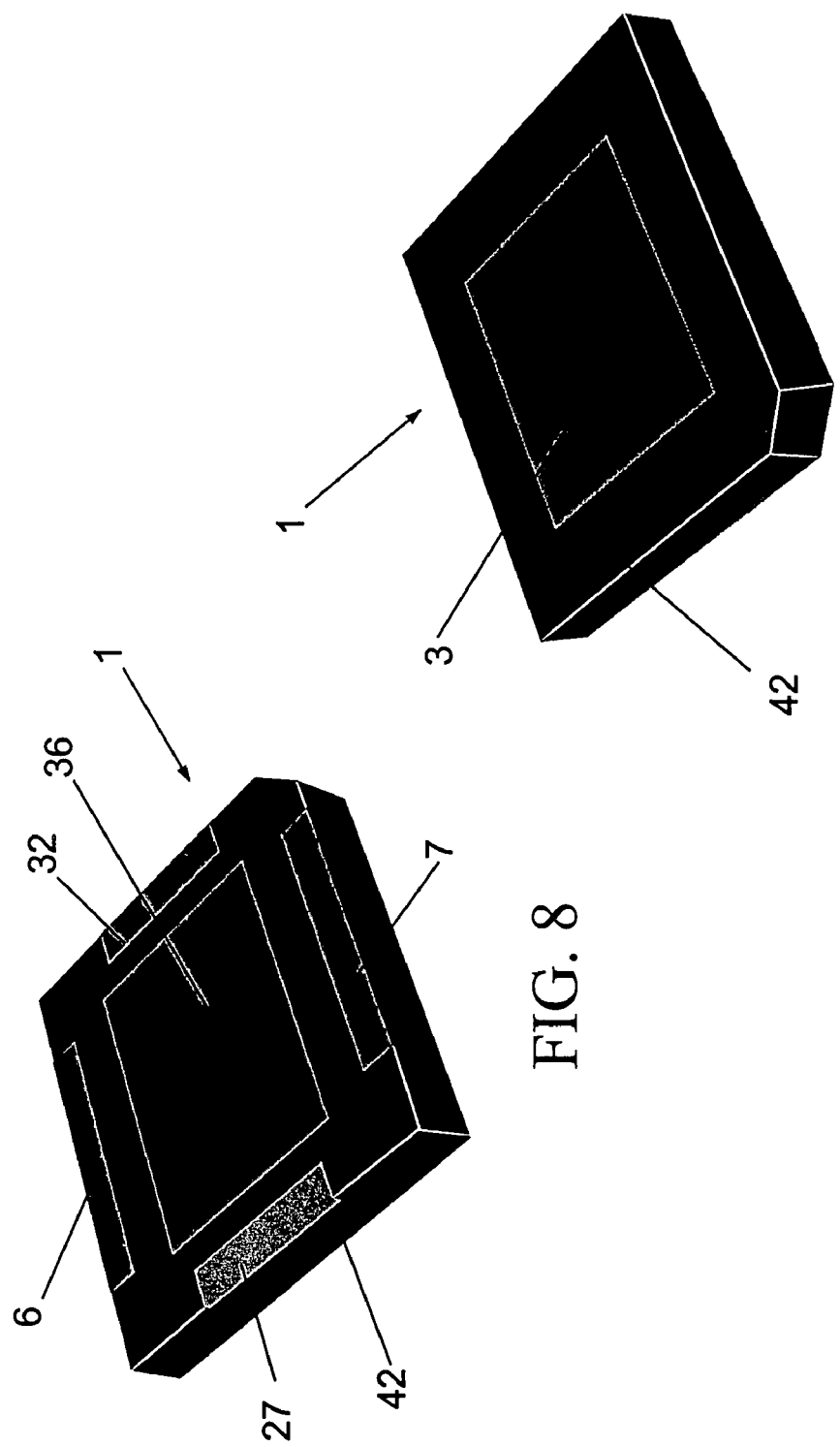

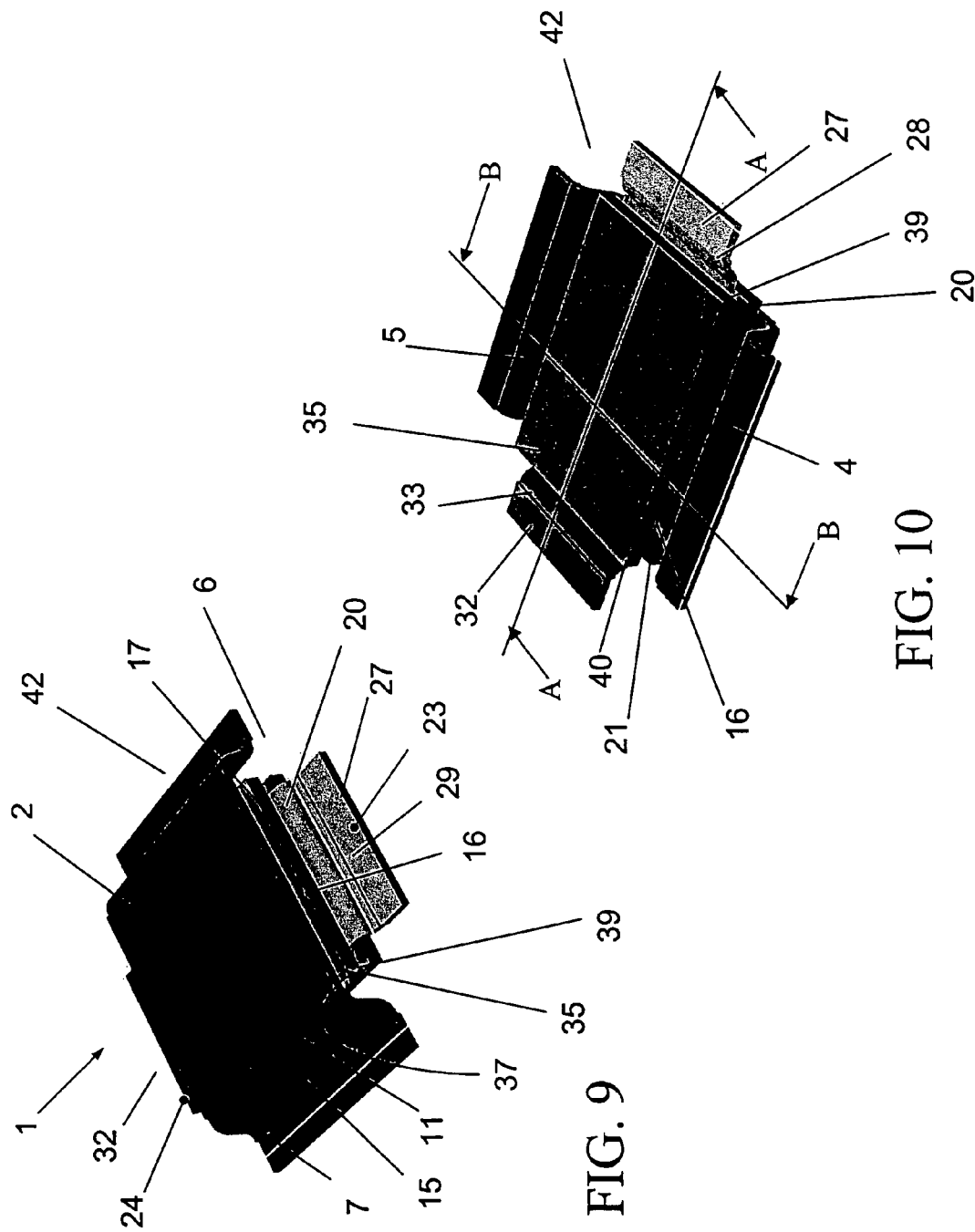

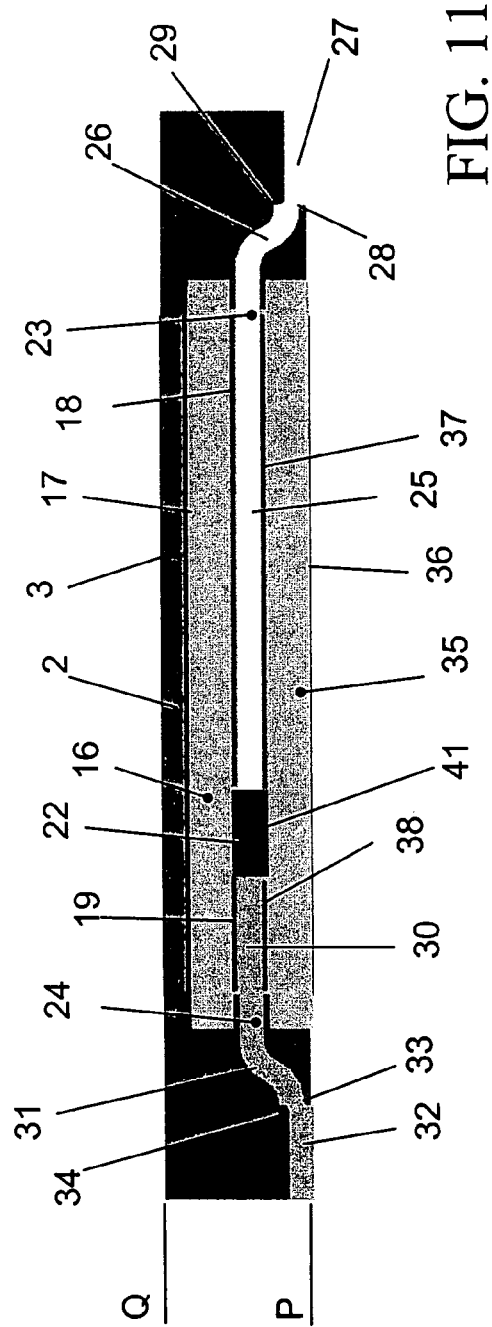
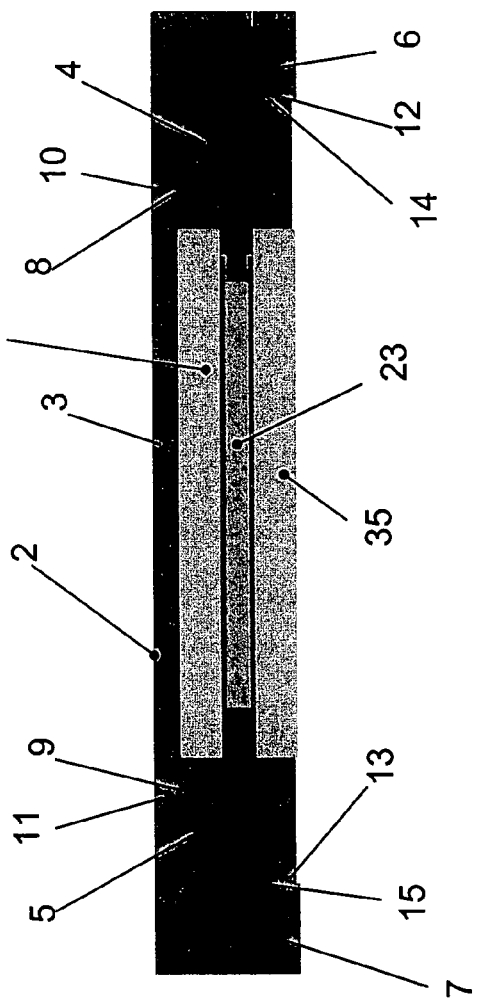
FIG. 11
FIG. 12

VERTICAL CONDUCTION POWER ELECTRONIC DEVICE PACKAGE AND CORRESPONDING ASSEMBLING METHOD

PRIORITY CLAIM

This application claims priority from European patent application No. 04425399.5 filed May 31, 2004, which is incorporated herein by reference.

TECHNICAL FIELD

The present invention relates to a vertical conduction power electronic device package and corresponding assembling method.

More particularly, one aspect of the present invention relates to a vertical conduction power electronic device package of the type comprising at least a main frame whereon at least a first semiconductor die is housed, which comprises at least a first and second conduction terminal defined on opposed sides.

An aspect of the invention relates particularly, but not exclusively, to a power device package for mobile applications and the following description is made with reference to this field of application for convenience of illustration only.

BACKGROUND

As it is well known, power electronic device packages essentially comprise a power electronic device integrated in a chip or in a die and mounted on a metal frame. The package also comprises some electric connection pins, projecting from a protection body or envelope realized with an insulating plastic material, for example an epoxy resin [Molding compound]. Connection pins allow, once the package is mouned on a printed circuit board, electronic signals to be transmitted between the power electronic devices and the conduction paths defined in the board.

Over the last few years, power device development has been highly sped up in view of reducing more and more the overall dimensions thereof, particularly for applications on mobile devices such as personal computers, mobile phones and the like.

This volume reduction has been obviously allowed also by the technology evolution and by the increase in the functions which can be integrated in a single chip wherein the power device is realized.

Moreover, the need to reduce the package dimension and weight increases with the higher and higher miniaturization of the power devices comprised therein.

In particular, the package size and the weight have considerably reduced over the last few years and, through the most recent technologies, the ratio between the highest "chip size" and the "package footprint" went from about 0.3 in the early nineties to about 0.8 at the end of the century.

The continous progresses in the microprocessor technology have also led to an increase in the operating frequency of power devices thus increasing the field of application thereof.

Obviously, in order to keep the power at the high operating frequencies, the current supplied to the devices, and thus the power density distributed on the printed circuit board wherein they are assembled, must be increased. Consequently, the printed circuit board parasitic components contribute to generate losses both in the static and in the dynamic performances of the installed devices.

Moreover, the operating frequency increase also calls for a particular attention in reducing the parasitic inductances both in the package and on the printed circuit board. It is thus important that packages have such a configuration as to ease the assembly in parallel of more units on the board.

In the particular case of a package for a power device better performances can be obtained by reducing the device output resistance as well as the parasitic capacitances and the protective body or envelope thermal resistance.

In fact, as it is well known, a Q-factor (FFOM) to evaluate the power package efficiency is the product of the output resistance (Ron) and of the package occupation area (foot print).1 The lower is this value, the more efficient is the package.

European patent application no. 0179714 by Thomson-CFS describes a first known solution to realize a power device package, schematically shown in FIG. 1. This solution provides the replacement of bonding wires (which traditionally allow the electronic device contact pad to be electrically connected with corresponding connection pins of the package incorporating them) with bridge copper foils. Therefore the resistive contributions linked to the device-package connections and to the current distribution on the device surface, as well as the thermal resistance thereof, are reducted, as it can be seen in the table of FIG. 4.

Although advantageous under several aspects, this first known technical solution has however a notable package size, thus keeping the package Q-factor high.

A second known solution, variously developed, is represented by a power device realized by means of a metal container, conveniently shaped, which brings the device drain on the same level as the upper surface thereof. An example of this embodiment is shown in FIG. 2 and described in the document MOSFET BGA design guide—Fairchild Semiconductor—August 2002. This solution allows the device output resistance to be reduced, since wire connections are missing, and the package occupation area to be reduced, since a protection resin is missing. Moreover, the metal container allows the heat exchange with the outside to be increased.

Although advantageous under several aspects, this second known technical solution has some drawbacks linked to the coplanarity between the metal container and the flat surface. Moreover, the resin absence makes the device more subject to the external environment effects with subsequent problems in terms of reliability in time.

It is also known to realize so-called vertical conduction multi-die packages. This embodiment provides that dies or power devices are arranged the one onto the other. This solution allows the assembled silicon area to be doubled, but at the detriment of the package thickness. An example of this technique is shown in FIG. 3 and described in U.S. patent application No. 2002/0096748 wherein two back-welded devices are used, through a back to back arrangement, in correspondence with the metal frame sides.

This known solution, although advantageous under some aspects, requires a connection between the power device source and gate terminals which traditionally occurs by means of wires, thus increasing the output resistance. Moreover, in the assembly step, this embodiment requires a device locking system suitable to prevent the same from moving from the positions thereof during a welding compound thermal reflow process (US 2002/0096748) and a double passage in the bonding equipments in order to connect the other electrodes of the two devices.

The technical problem underlying the present invention is to realize a vertical conduction power electronic device package having such structural and functional features as to allow drawbacks mentioned with reference to the prior art to be overcome and as to be consistent with the traditional surface assembly methods in order not to increase the production and assembly cost on the printed circuit board.

SUMMARY

According to one aspect of the present invention, a supplementary metal frame puts the conduction terminals of the power device(s) housed in the package in contact with each other.

The features and advantages of the package and assembly method according to the invention will be apparent from the following description of embodiments given by way of non limiting examples with reference to the attached drawings.

BRIEF DESCRIPTION OF THE DRAWINGS

FIGS. 7 and 8 is a perspective view from above and below respectively of the package of FIG. 5.

FIGS. 9 and 10 is a look-through view of the package of FIGS. 7 and 8.

FIG. 11 is a 180°-rotated sectional view, according to the axis A-A of the package of FIG. 10.

FIG. 12 is a 180°-rotated sectional view, according to the axis B-B, of the package of FIG. 10.

DETAILED DESCRIPTION

Figures 1, 4:
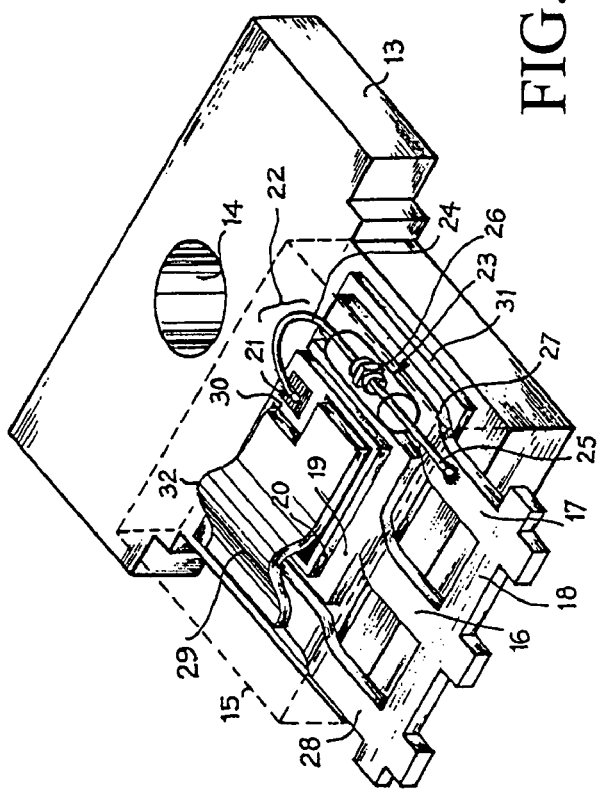
FIGS. 1, 2 and 3 schematically show some embodiments of an electronic device package according to the prior art.
FIG. 4 is a comparison table of some technical particulars of the package of FIG. 1.
Figure 2:
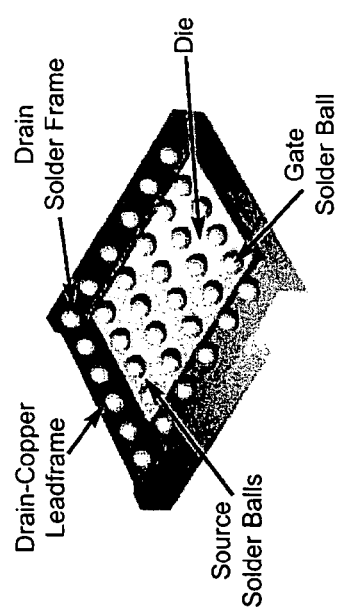
Figure 3:
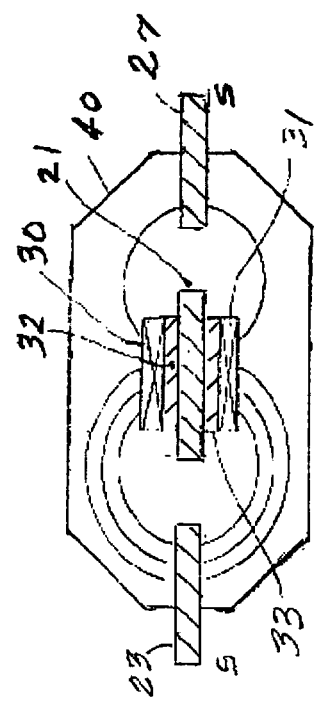
Figure 5:
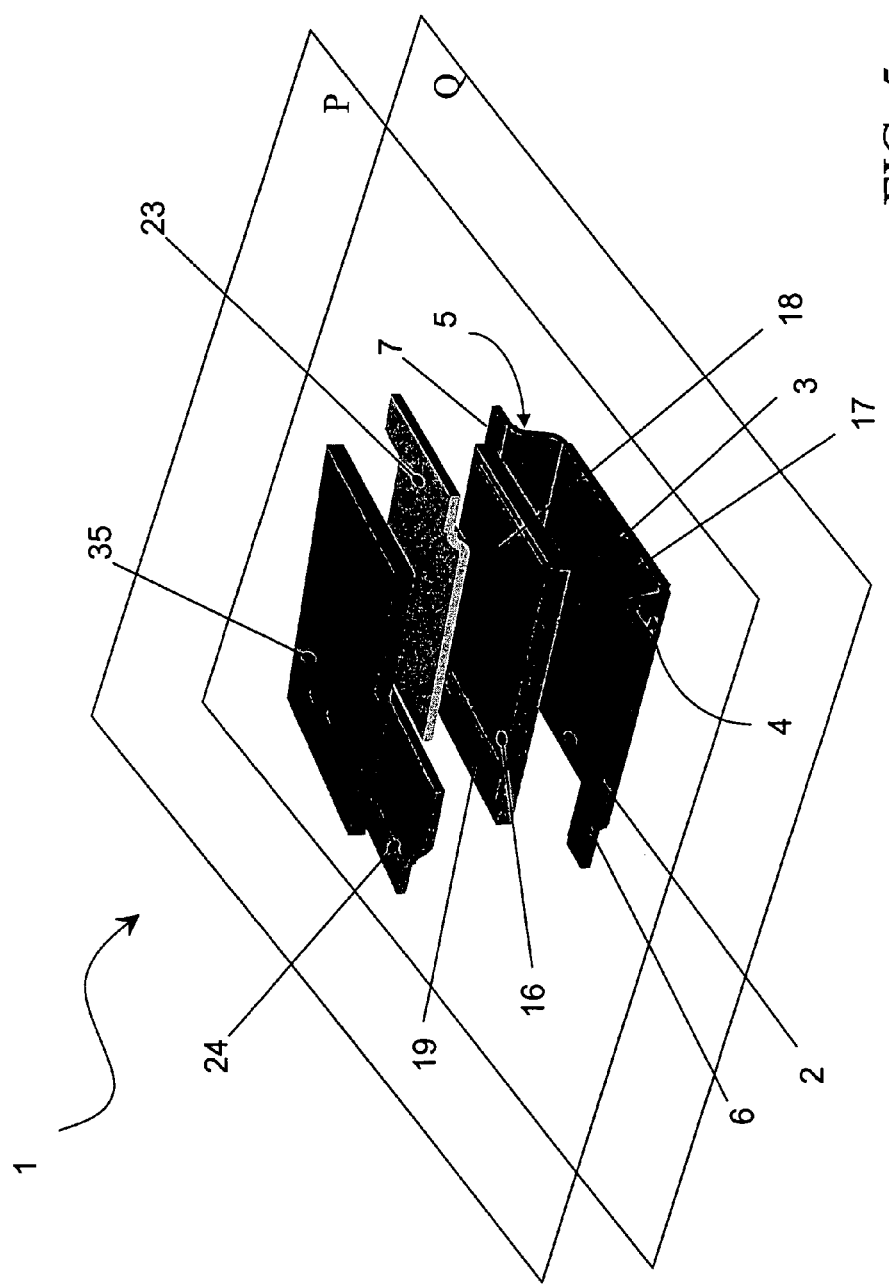
FIG. 5 is a schematic exploded view of a package realized according an embodiment of the present invention.
Figure 6A:
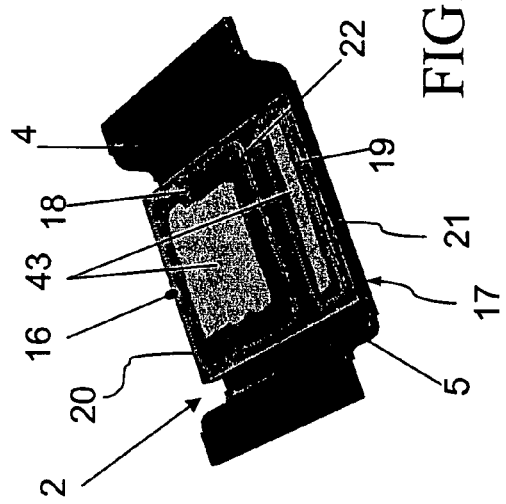
FIGS. 6A to 6D show the package of FIG. 5 in different steps of the assembly method acording to an embodiment of the invention.
Figure 6B:
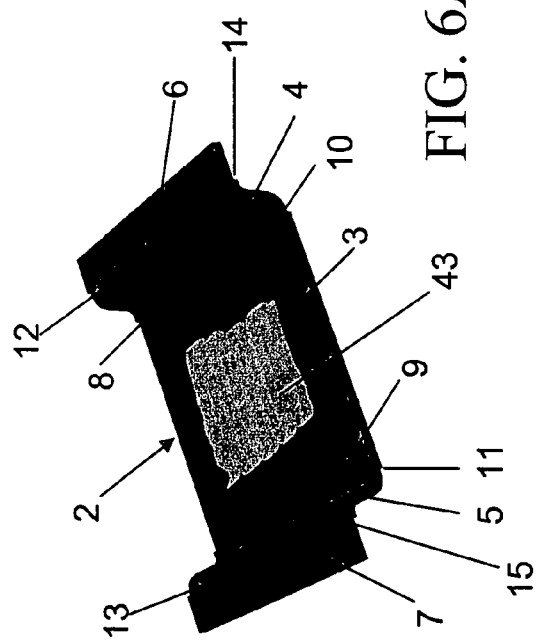
Figure 6C:
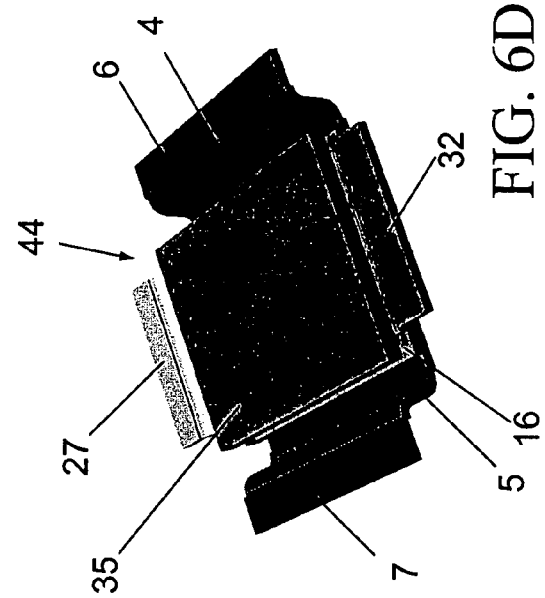
Figure 6D:
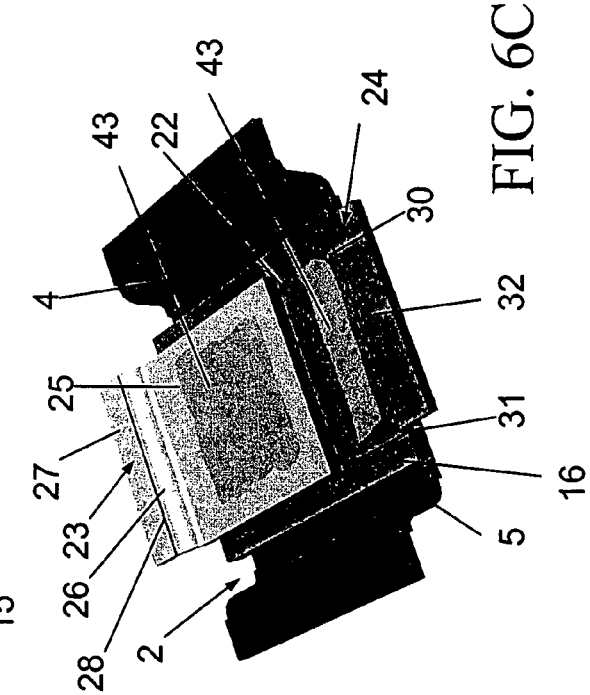

With reference to the drawings, and particularly to the example of FIG. 5, a vertical conduction power device package realized according to an embodiment of the present invention is generally and schematically indicated with 1.

The package 1 comprises a metal frame 2, in a conductive material, substantially "U"-shaped and defining a flat portion 3, The package 1 comprises a conductive-material metal frame 2, substantially "U" shaped and defining a flat portion 3, with substantially rectangular plan, and two curved gull-wing-shaped portions 4 and 5, rising on parallel sides of the flat portion 3 and on the same side as a plane Q defined by the flat portion 3.

The two curved portions 4 and 5 have respective flat free ends 6 and 7 turned outwards with respect to said flat portion 3. The flat free ends 6 and 7 are coplanar and they belong to a same plane P being parallel to the plane Q.

Each curved portion 4 and 5 of the metal frame 2 is as thick as the flat portion 3. Near the flat portion 3, the curved portions 4 and 5 shift upwards, with respect to the plane Q, defining inside the metal frame 2 respective first steps 8 and 9 and outside respective seconds steps 10 and 11, as it can be seen in greater detail in FIGS. 6A-6D and in the section of FIG. 12.

Similarly, the free ends 6 and 7 shift upwards near the respective curved portions 4 and 5 with respect to the plane Q, defining inside the metal frame 2 respective third steps 12 and 13 and outside respective fourth steps 14 and 15.

The flat portion 3 houses a first semiconductor die or plate 16, particularly of the three-conduction-terminal type.

As it can be particularly seen in FIG. 5, the first die 16 has on one side a first conduction terminal 17 occupying almost the whole side surface. On the opposite side, the first die 16 has a second conduction terminal 18 and a third conduction terminal 19 which occupy different surface portions. The second terminal 18 occupies an area in correspondence with a first edge 20 of the first die 16, while the third terminal 19 occupies an area in correspondence with a second edge 21, opposed to the first edge 20. An intermediate non conductive area 22 is arranged between the second terminal 18 and the third terminal 19.

Particularly, the second terminal 18 and the third terminal 19 can be realized in a wettable metal material such as TiNiAu.

The first die 16 is housed with the first conduction terminal 17 facing the flat portion 3 and with the second 18 and third terminal 19 arranged crosswise with respect to the two curved portions 4 and 5 of the metal frame 2, each terminal near the free periphery of the flat portion 3.

Advantageously, as shown always in FIG. 5, the package 1 has at least a first intermediate frame 23 realized in a conductive material and arranged above the first die 16 in correspondence with the second terminal 18.

In the example of FIG. 5, considering a three-terminal die 16, the package 1 comprises a second intermediate frame 24 always realized in a conductive material and arranged above the first die 16 in correspondence with the third terminal 19.

In particular, the first intermediate frame 23 and the second intermediate frame 24 are realized in metal, for example copper—and all or some portions of the surfaces thereof can be coated with another more wettable material, for example silver (Ag) or nickel (Ni).

The first intermediate frame 23 has a first flat portion 25, a second substantially S-and-gull-wing-shaped portion 26, and a flat free end 27 being adjacent to each other. The free end 27 shifts upwards near a connection point to the second portion 26, in the opposite direction with respect to the first flat portion 25, being suitable to define a first step 28 in the upper portion and a second step 29 in the lower portion, as it can be seen in FIGS. 9, 10 and 11.

Similarly, the second intermediate frame 24 has a first flat portion 30, a second substantially S-and-gull-wing-shaped portion 31, and a flat free end 32 being adjacent to each other. The free end 32 shifts upwards near a connection point to the second portion 31, in the opposite direction with respect to the first flat portion 30, being suitable to define a first step 33 in the upper portion and a second step 34 in the lower portion.

The first intermediate frame 23 has the first flat portion 25 being overlapped to the second terminal 18 and the second S-shaped portion 26 rising near the first edge 20 of the first die 16 between the two curved portions 4 and 5 of the metal frame 2. The first intermediate frame 23 is so shaped that, arranged on the second terminal 18, the free end 27 is coplanar to the free ends 6 and 7 of the metal frame 2, thus belonging to the plane P.

Similarly, the second intermediate frame 24 has the first flat portion 30 being overlapped to the third terminal 19 and the second S-shaped portion 31 rising near the second edge 21 of the first die 16 between the two curved portions 4 and 5 of the metal frame 2. The second intermediate frame 24 is so shaped that, arranged on the third terminal 19, the free end 32 belongs to the plane P.

The package 1 comprises a second semiconductor die or plate 35 being shaped in a similar way to the first three-conduction-terminal die 16.

The second die 35 has thus on one side a first conduction terminal 36 occupying almost the whole surface of said side while on an opposite side it has a second conduction terminal 37 and a third conduction terminal 38 occupying different surface portions of that side. The second terminal 37 occupies an area in correspondence with a first edge 39 of the second die 35, while the third terminal 38 occupies an area in correspondence with a second edge 40 opposed to the first edge 39. A non conductive area 41 is arranged between the second terminal 37 and the third terminal 38.

The second die 35 is housed on the first 23 and second intermediate frame 24 with the second conduction terminal 37 being overlapped to the first flat portion 25 of the first intermediate frame 23, and with the third terminal 38 facing the first flat portion 30 of the second intermediate frame 24.

Therefore the first edge 39 of the second die 35 is spaced from the second portion 26 of the first intermediate frame 23 and similarly the second edge 40 is spaced from the second portion 31 of the second intermediate frame 24.

The first terminal 36 of the second die 35 is arranged above with respect to the first die 16 and to the intermediate frames 23 and 24 and the external surface thereof advantageously belong to the plane P.

Advantageously, the so-realized package 1 brings all conductions terminals in correspondence with an upper surface thereof on the plane P.

Obviously, the package 1 is coated by injection with a resin 42 not indicated in FIG. 5 for greater clearness of illustration and, advantageously, the whole or at least part of the flat portion 3 is not coated with the resin 42.

An embodiment of the invention also relates to an assembly method of a power device package being shown with reference to FIGS. 6A to 6D.

The assembled package is the one shown in FIG. 5 and the same numeral references will be used hereafter to indicate corresponding parts.

The assembly method according to an embodiment of the invention provides the following steps:
providing a "U"-shaped metal frame 2 defining a flat portion 3 and curved portions 4 and 5;
dispersing a welding compound 43 in correspondence with the flat portion 3; and
housing a first die 16 on the flat portion 3.

Particularly, the first die 16 has a first terminal 17 on a side turned towards the flat portion 3 and on an opposed side a second terminal 18 and a third terminal 19. The first die 16 is housed with a first edge 20 and a second edge 21 being parallel to each other and arranged crosswise to the two curved portions 4 and 5 of the metal frame 2. The second terminal 18 is thus near the first edge 20 and the third terminal 19 near the second edge 21.

The method further provides the steps of:
further dispersing some welding compound 43 in correspondence with the terminals 18 and 19 of the first die 16 and, advantageously according to an embodiment of the invention
locating a first intermediate frame 23 on said first die 16.

In particular, a first portion 25 of the first intermediate frame 23 is arranged on the second terminal 18 with a second portion 26 projecting in correspondence with the first edge 20 of the first die 16 rising on the opposite side with respect to the flat portion 3 of the metal frame 2.

In the embodiment being shown which comprises three-terminal dies, the method further comprises the step of locating a second intermediate frame 24 on said first die 16.

Similarly, a first portion 30 of the second intermediate frame 24 is arranged on the third terminal 19 with a second portion 31 projecting in correspondence with the second edge 21 of the first die 16 rising on the opposite side with respect to the flat portion 3.

Advantageously according to an embodiment of the invention, the assembly method also provides the steps of:
further dispersing some welding compound 43 on each first flat portion 25 and 30;
housing a second die 35 aligning it with the first die 16 with a first edge 39 in correspondence with the first edge 20 of the first die 16 and a second edge 40, parallel to the first edge 39, in correspondence with the second edge 21 of the first die 16.

The so-arranged second die 35 has a second terminal 37 being overlapped to the first flat portion 25 and to the second terminal 18 of the first die 16 and also a third terminal 38 being overlapped to the first flat portion 30 and to the third terminal 19 of the first die 16, as it can be particularly seen in FIG. 11.

The second portion 26 is spaced from the first edge 39 of the second die 35 and similarly the second portion 31 is spaced from the second edge 40.

A multi-die device 44 is thus realized, which is inserted in a remelting furnace in order to let the welding compound 43 undergo a thermal hardening process.

The method thus continues with the well known steps of:
coating the device 44 by injection with a resin 42 defining a parallelepiped body suitable to form the package 1 paying attention not to cover the flat portion 3;
shearing, if necessary, the free ends 6 and 7 of the metal frame 2; and eventually
a <<lead forming>> operation.

The assembly method according to this embodiment of the invention thus allows a multi-die semiconductor device package to be realized having the conduction terminals of the single dies brought to a same flat surface.

Figure 13:
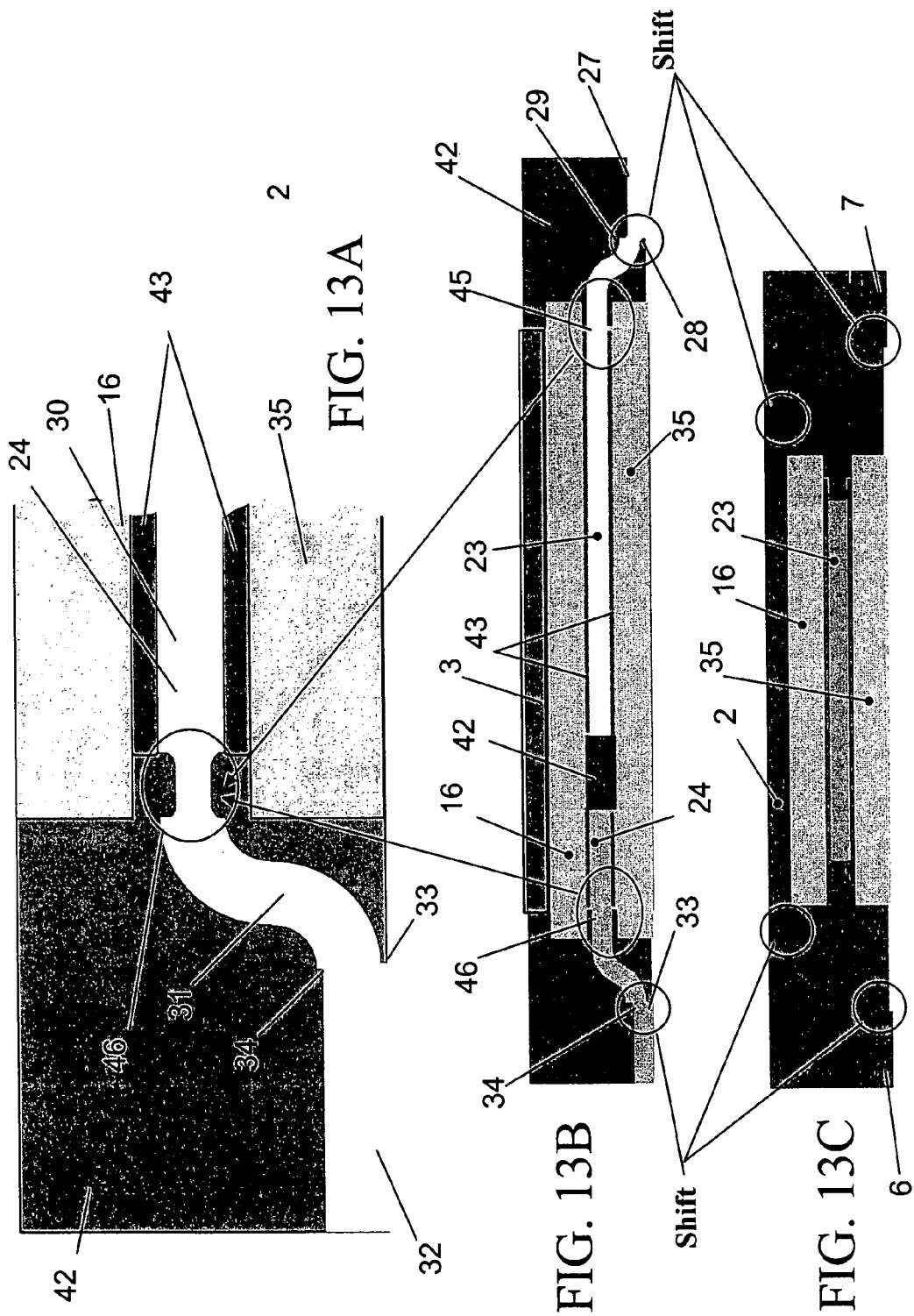
FIGS. 13A to 13C, FIG. 14 and FIG. 15 show alternative embodiments of details of the package according to other embodiments of the present invention.

It is also possible to provide alternative embodiments of the package according to other embodiment of the invention, as shown in FIGS. 13A, 13B and 13C. According to these alternative embodiments the first flat portion 25 of the first intermediate frame 23 and the first flat portion 30 of the second intermediate frame 24 have near the second portion 26 and 31 respective narrowings 45 and 46. Advantageously these narrowings 45 and 46 allow the resin 42 to fill in an homogeneous and uniform way the area between the first die 16 and the second die 35 decreasing the parasitic currents and improving the insulation and the performances of the package 1.

Figure 14:
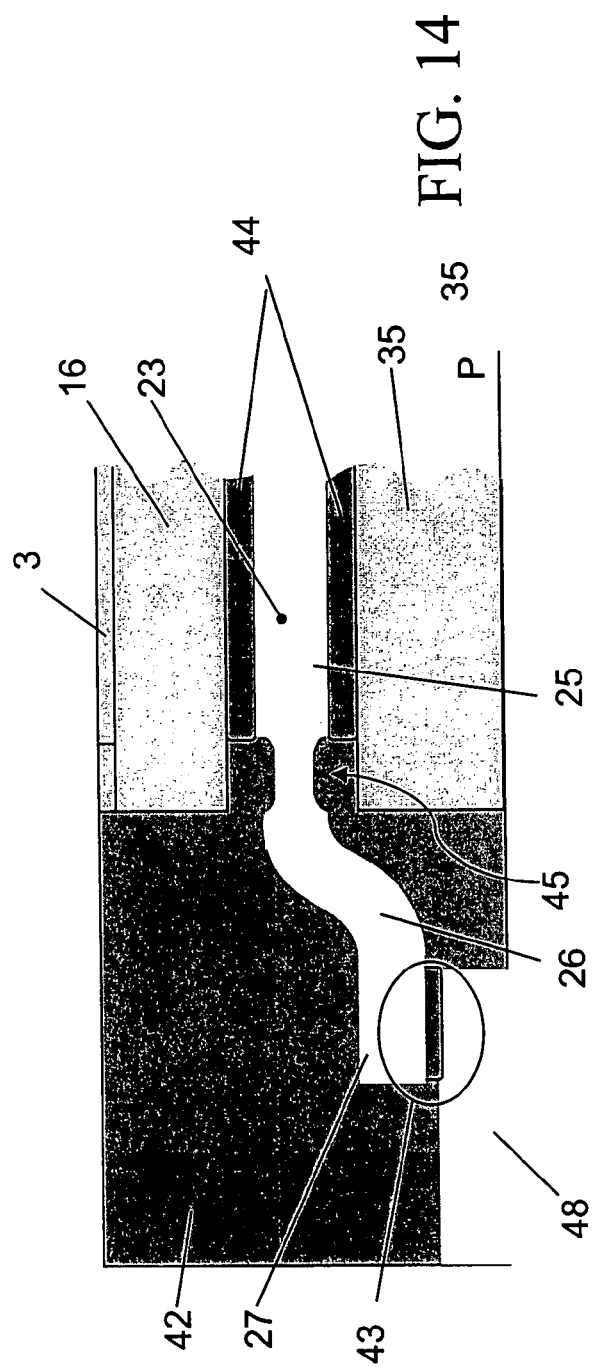

A further embodiment of the first intermediate frame 23 is shown in FIG. 14, wherein the first flat portion 25 has near the second portion 26 a narrowing 45. The second portion 26 extends according to a S-or-gull-wing shape near the plane P but with the external surface of the free end 27 not reaching the plane P. In the assembling step on the free end 27 of the first intermediate frame 23 some conductive welding compound 43 is dispersed and thus a known lead 48 is associated thereto. In this solution the mechanical and electric connection of the vertical conduction power device package 1 occurs in the assembling step.

Obviously, the second intermediate frame 24 can have a similar embodiment to the one of the above described first intermediate frame 23.

Figure 15:
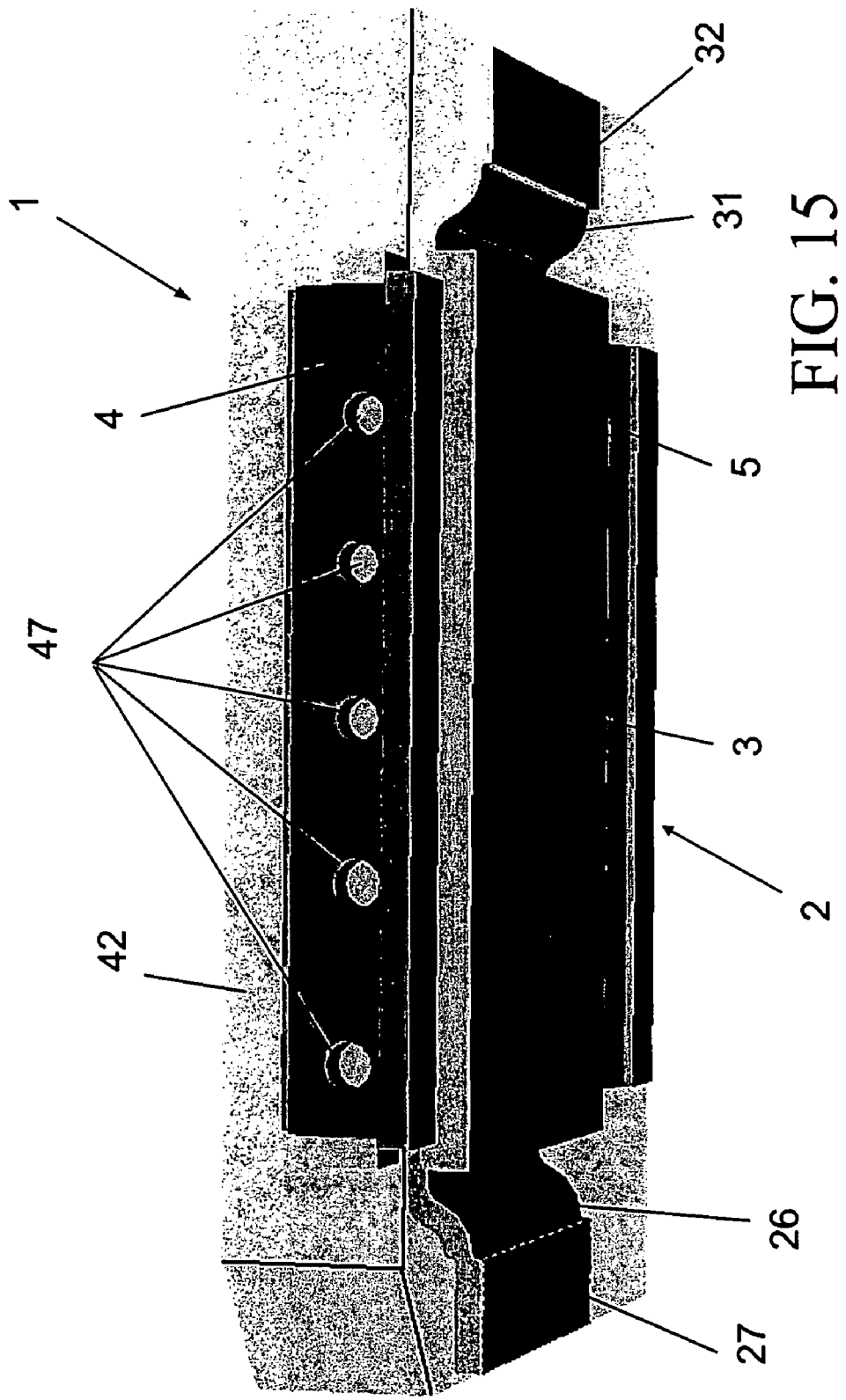

In a different embodiment, shown in FIG. 15, the S-shaped curved portions 4 and 5 of the metal frame 2 of the package 1 can advantageously comprise one or more holes 47. These holes 47 allow the metal frame 2 anchorage to the resin 43 to be improved and they also allow the resin 43 to better flow in all the interstices of the package 1.

Similarly, the first intermediate frame 23 and the second intermediate frame 24 can have similar holes 47 in correspondence with the second portion 26 and 31.

Advantageously according to another embodiment of the invention, the first semiconductor die 16 and the second semiconductor die 35 can be three-conduction-terminal devices such as MOS power, IGBT, MCT, BJT, JFET and the like or two-conduction-terminal for example junction diodes or Schottky diodes arranged in series, back to back or in parallel.

FIGS. 16A and 16B, 17A and 17B, 18A and 18B, 19A and 19B, 20A and 20B and 21 show sections of alternative embodiments of the package according to embodiments of the invention and corresponding wiring diagrams.

Figure 16B:
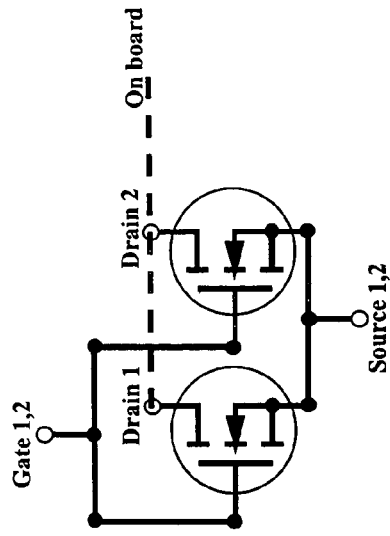
FIGS. 16A and 16B, 17A and 17B, 18A and 18B, 19A and 19B, 20A and 20B and FIG. 21 show further alternative embodiments of a package according to a further embodiment of the present invention.
Figure 16A:
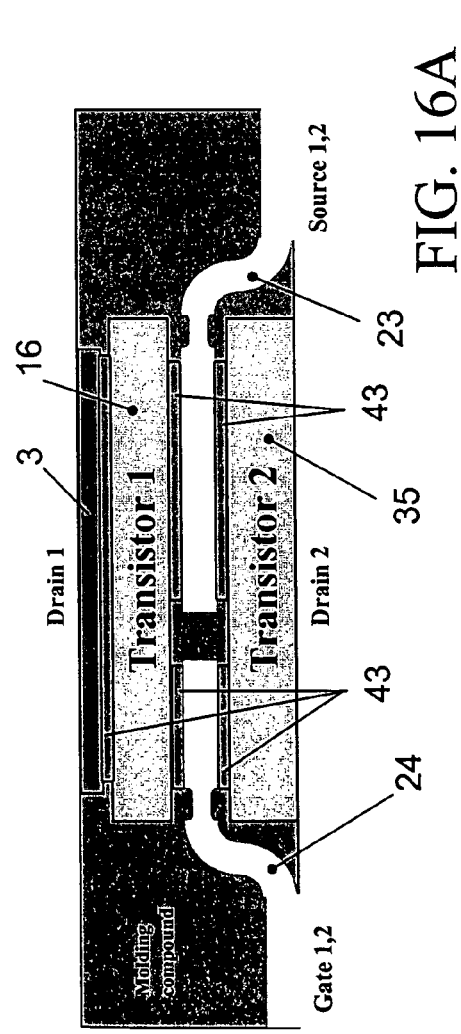

In particular FIGS. 16A and 16B show a first die 16 suitable to integrate a first MOS transistor and a second die 35 suitable to integrate a second MOS transistor in a common gate-source arrangement. In that case the first transistor and the second transistor are arranged with the gate and the source facing to each other so that, by means of the first intermediate frame 23 and the second intermediate frame 24, they are brough to the surface. In fact, the first transistor drain is brought to the surface by the free ends 6 and 7 of the metal frame 2 (not shown in FIG. 16A), while the second transistor drain is already on the surface.

Figure 17B:
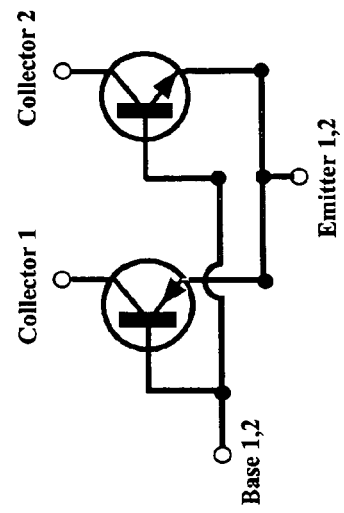
Figure 17A:
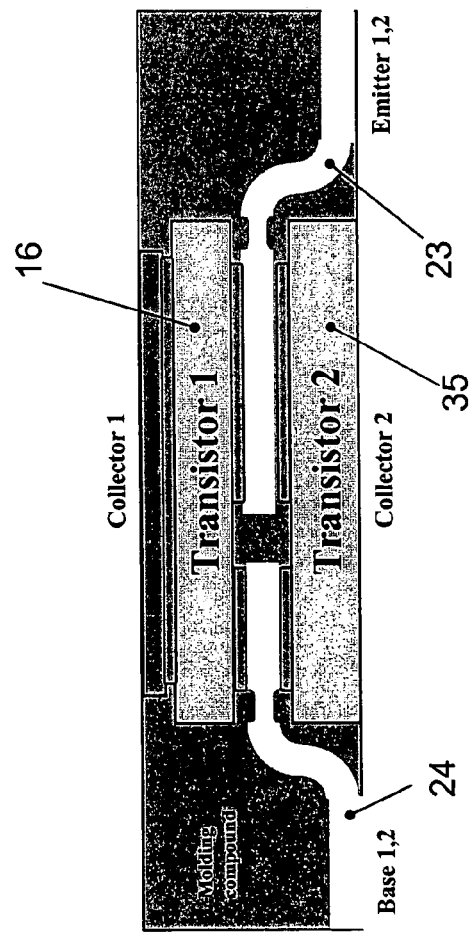

FIGS. 17A and 17B show a similar configuration to the one shown in FIGS. 16A and 16B, but with bipolar conduction transistors. These Figures show a first die 16 suitable to integrate a first transistor and a second die 35 suitable to integrate a second transistor, according to a common base-emitter arrangement. In that case the first transistor and the second transistor are arranged with the base and the emitter facing to each other with the interposition of the first intermediate frame 23 and of the second intermediate frame 24.

Figure 18B:
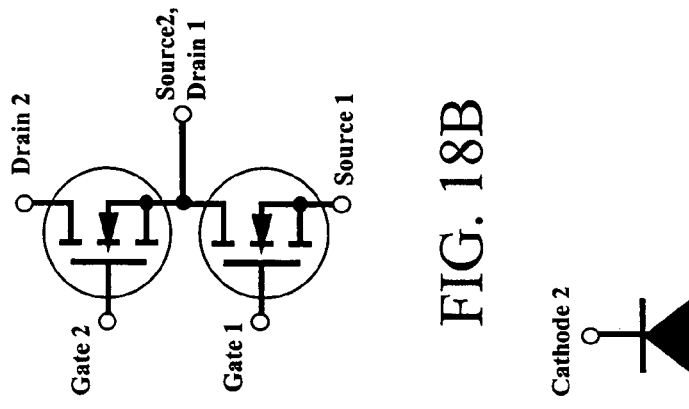
Figure 18A:
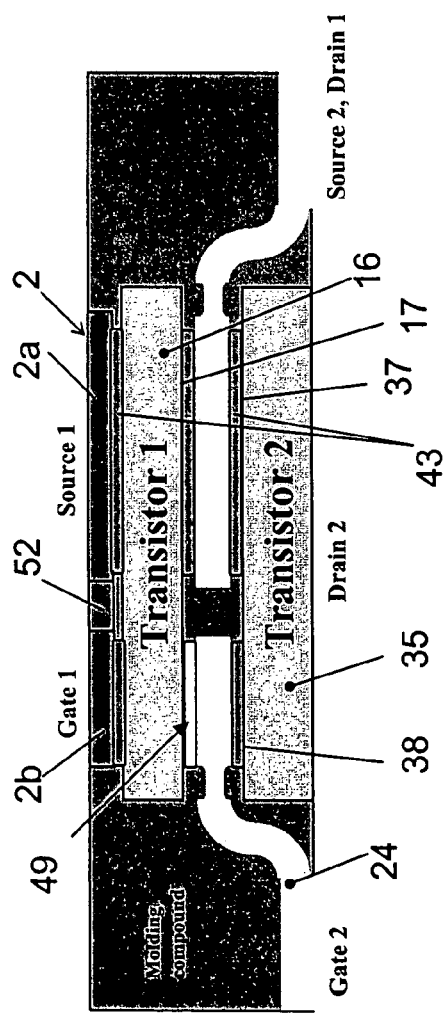

FIGS. 18A and 18B show a first die 16 suitable to integrate a first transistor and a second die 35 suitable to integrate a second transistor, according to a series arrangement according to another embodiment of the present invention. In that case the first transistor has the first drain terminal 17 facing the second and third gate and source terminal 37 and 38 of the second transistor. In order to avoid the conductivity between the first terminal 17 and the second intermediate frame 24 some non conductive compound 49 is dispersed. The second terminal 18 and the third terminal 19 of the first transistor or die 16 face the flat portion 3 of the metal frame 2. In this specific solution the metal frame 2 has a non conductive area 52 to electrically split a first and a second similarly shaped portion 2a and 2b. The first and the second portion 2a and 2b comprise each a first and a second free end portion, not shown in FIG. 18A. The non conductive area 52 is arranged crosswise to the free ends. The free ends allow the gate and source of the first transistor integrated on the die 16 to be brought on the surface.

Figure 19B:
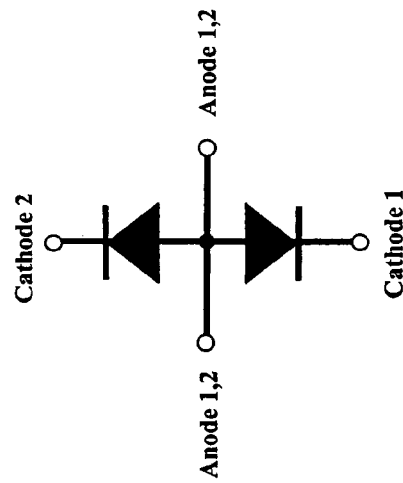
Figure 19A:
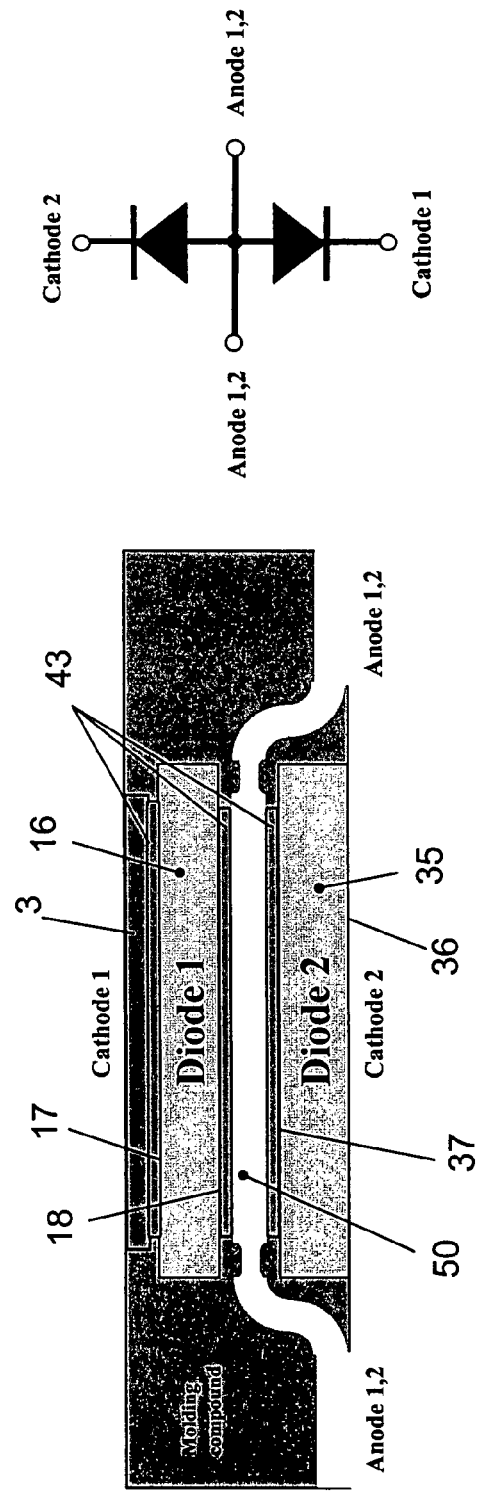

FIGS. 19A and 19B show the package 1 in an embodiment with the first die 16 and the second die 35 at two terminals, i.e. in this specific cas suitable to integrate two diodes with common anode. In this solution the package 1 has a single intermediate frame 50, corresponding to the junction of the first and second intermediate frames 23 and 24, having the same shape as the metal frame 2. The first die 16 is arranged with the first terminal 17, the cathode, facing the flat portion 3 of the metal frame 2 while the second terminal 18, the anode, will face the single intermediate frame 50. The second die 35 has the second terminal 37, the anode, facing the single intermediate frame 50 while the first terminal 36, the cathode, will be on the surface.

Figure 20B:
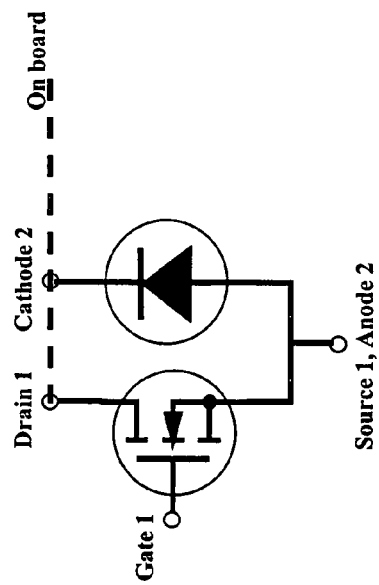
Figure 20A:
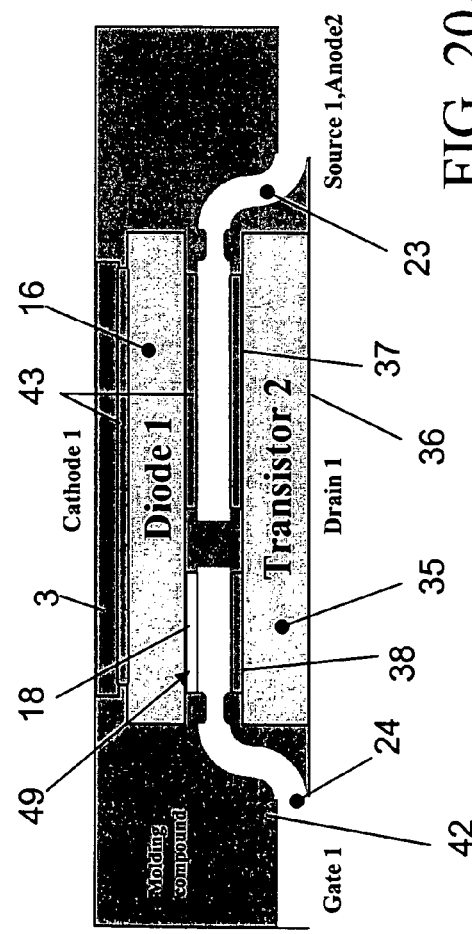

FIGS. 20A and 20B show the package 1 in an embodiment with the first die 16 at two conductive terminals, i.e. in this specific case suitable to integrate a diode, and with the second three-terminal conductive die 35, i.e. suitable to integrate a transistor in an arrangement with associated source and anode. The first die 16 is arranged with the first terminal 17, the cathode, facing the flat portion 3 of the metal frame 2 while the second terminal 18, the anode, will face the first and second intermediate frames 23 and 24. The second die 35 has the second and third terminals 37 and 38, the source and the gate, facing the first die 16 while the first terminal 36, the drain, will be on the surface. Some non conductive compound 49 is disposed between the second terminal 18 of the first die 16 and the second intermediate frame 24 in order to avoid any conductivity between the second terminal 18 of the first die 16 and the third terminal 38 of the second die 35.

Figure 21:
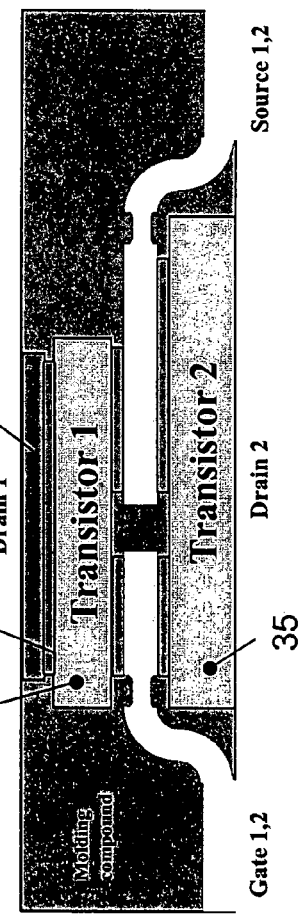

FIG. 21 shows the package 1 in an embodiment with a first three-conductive-terminal die 16 having a reduced size with respect to a second die 35 having always threee conductive terminals suitable to integrate respective transistors. In that case the package 1 has the metal frame 2 with a substantially reduced size and similar to the first die 16. The first die 16 is arranged with the first terminal 17, the drain, facing the flat portion 3 of the metal frame 2 while the second terminal 18 and the third terminal 19, the gate and the source, respectively facing the first and second intermediate frames 23 and 24. The second die 35 has the second and third terminals 37 and 38, the gate and the source, facing the first die 16 while the first terminal 36, the drain, is on the surface.

Figure 22:
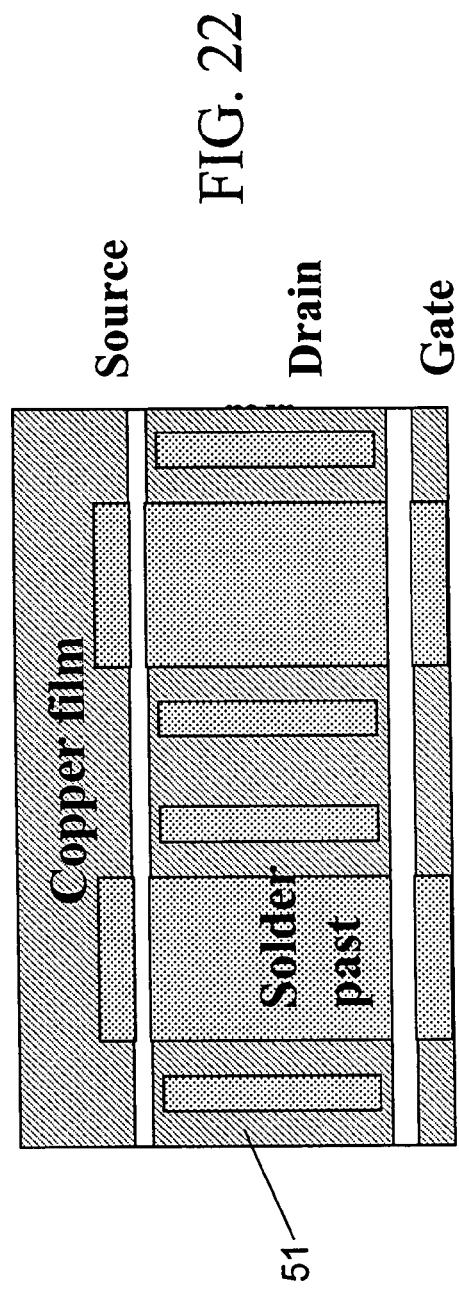
FIG. 22 shows a portion of a printed circuit board with the indication of the connection paths betweeen two packages arranged in parallel, each one being realized according to another embodiment of the present invention.

FIG. 22 shows a printed circuit board 51 being preset for the parallel arrangement of two packages realized according to an embodiment of the present invention. As it can be seen, the printed circuit board paths are considerably simplified because of the innovative structure of the packages realized according to the invention.

Figure 23:
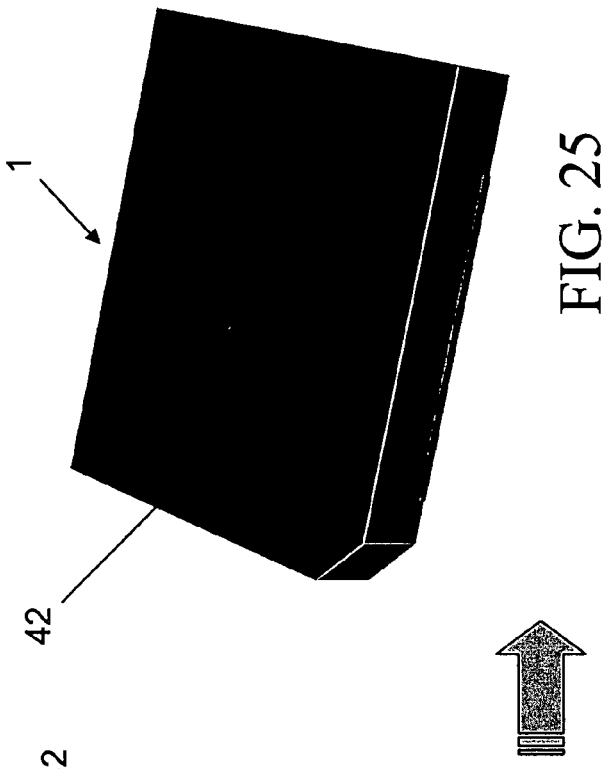
FIGS. 23 to 28 show further alternative embodiments of a package according to an embodiment of the present invention.
Figure 25:
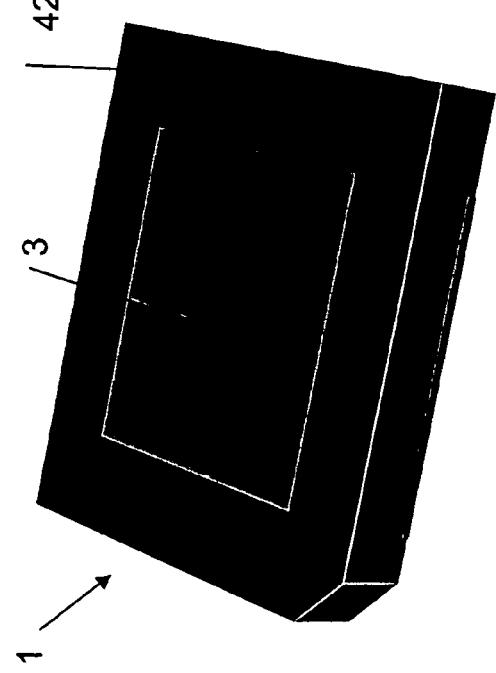
Figure 24:
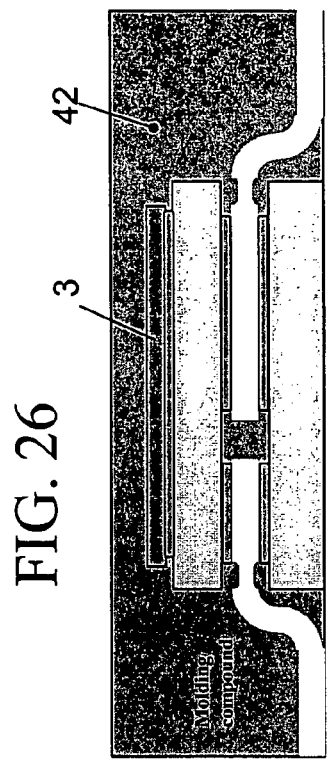
Figure 26:
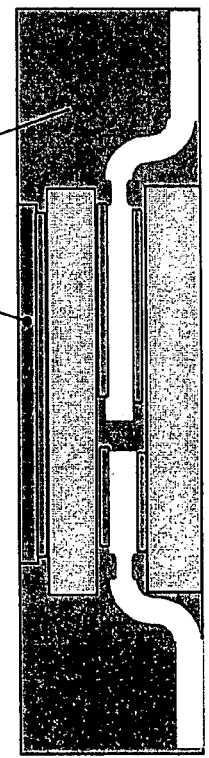

Advantageously in a further embodiment the covering resin 42 of the package 1 incorporates the flat portion 3 of the metal frame 2, as shown in FIGS. 25 and 26 in comparison with the previously described embodiment shown for convenience in FIGS. 23 and 24.

Figure 27:
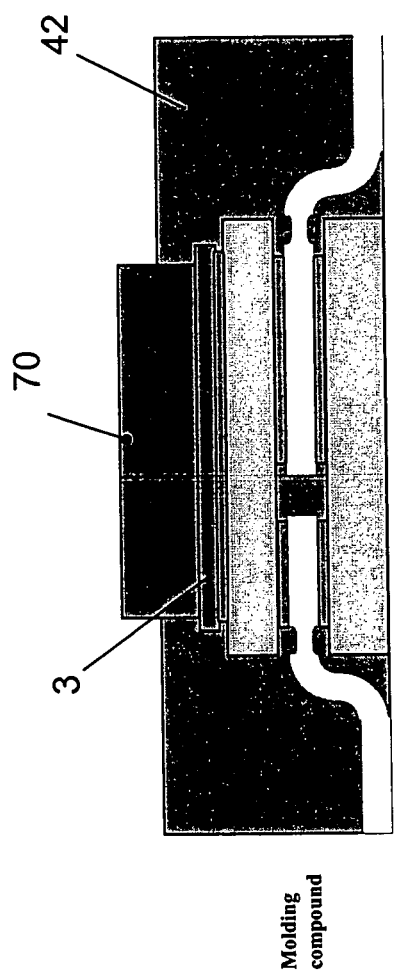
Figure 28:
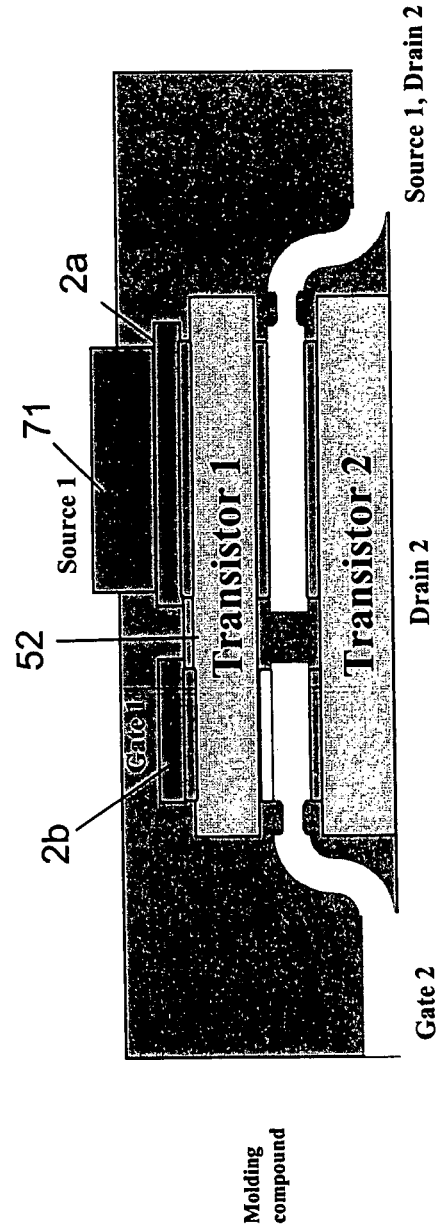
Figure 29:
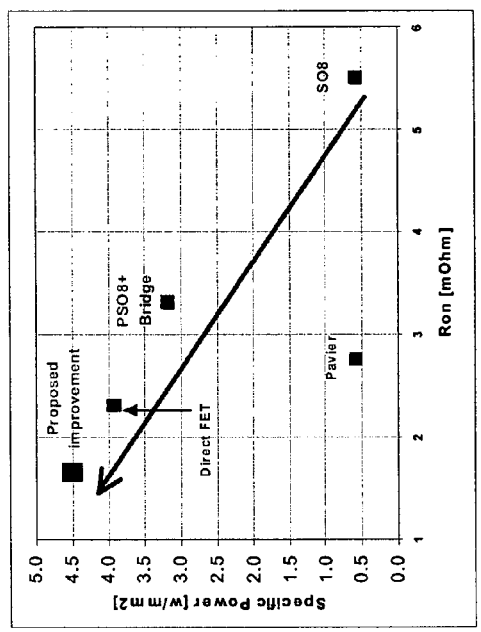
FIGS. 29 and 30 show diagrams comparing the Q-features between packages realized in a traditional way and the package according to an embodiment of the present invention.
Figure 30:
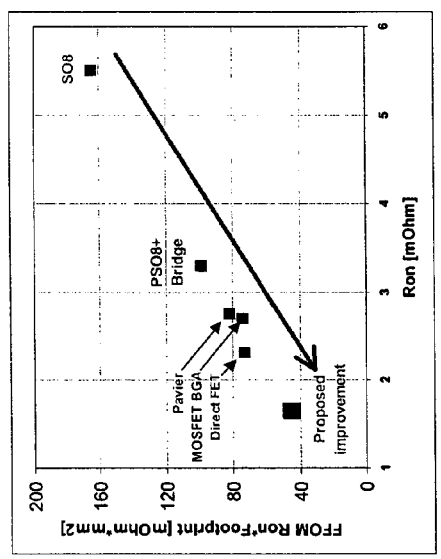

In a further embodiment, as shown in the example of FIG. 27, the flat portion 3 of the metal frame 2 has a projection 70 which, starting from the flat portion 3, extends on the opposite side with respect to the curved portions 4 and 5. Advantageously, in this embodiment, a part of the projection 70 goes out from the covering resin 42. This configuration is particularly suitable for example in the case shown in FIG. 28, wherein the portion 2a of the metal frame 2 has a projection 71 going out from the covering resin 42 and allowing a convenient known thermal dissipator to be pasted by interarrang of a conductive adhesive.

An advantage of the vertical conduction power electronic device package realized according to embodiments of the present invention is to bring on a same surface level all the conduction terminals of the single semiconductor devices composing the package, by advantageously using one or more conductive intermediate frames.

A considerable advantage is obtained by replacing the bonding wires, for electrically connecting the terminals of the package electronic devices, with intermediate metal frames, drastically reducing the output resistance and improving the Q factor FFOM, i.e. the package efficiency.

A further advantage is the considerable thermal dissipation of the present invention, in fact the so-realized package has the first conduction terminal, which could be considered as the device drain, facing the printed circuit board and it has also the flat portion 3 of the metal layer 2 exposed to the environment with the opportunity to associate it to a convenient heat dissipator.

The presence of steps in correspondence with curved portions is also advantageous, concerning both the metal frame and the intermediate frames, to delimit the resin expansion keeping free the surfaces to be uncovered.

Another advantage of embodiments of the present invention is to realize reduced-size vertical conduction power electronic device packages being suitable to improve the package performances and efficiency.

A further advantage of embodiments of the present invention is to realize a compact-shaped package allowing static and dynamic losses to be considerably reduced improving the package efficiency at high operating frequencies.

From experimental tests carried out by the Applicant it has been possible to verify that the package obtained according to embodiments of the invention has a reduced thermal resistance obtaining a specific power, i.e. a power which can be dissipated per area unit, being very high as it can be seen from the diagram shown in FIG. 23.

Always from experimental tests carried out by the Applicant it is possible to verify that the package realized according to embodiments of the invention has an extremely reduced Q factor FFOM as it can be seen in the comparison diagram of FIG. 24.

A further advantage of so-realized packages is evident from the simplified printed circuit board paths in the case of parallel arrangements of two or more packages.

Last but not least, the package realized according to embodiments of the invention is particularly competitive from the economic point of view with respect to all the other techniques presently used in this field. In particular, this solution is simple and easy to realize besides comprising a single manufacturing step in the furnace for reflowing the welding compound or the adhesive used to fix the devices and the frames to each other.

What is claimed is:

1. A vertical conduction power electronic device package, comprising:

at least a metal frame suitable to house at least a plate or first semiconductor die having at least a first and a second conduction terminal on respective opposed sides of said first semiconductor die, said first conduction terminal being in contact with said metal frame;

wherein the vertical conduction power electronic device package comprises at least one first intermediate frame arranged in contact with said second conduction terminal;

wherein the vertical conduction power electronic device package comprises at least a second intermediate frame arranged in contact with said first semiconductor die, in correspondence with a third conduction terminal arranged on the same side as said second conduction terminal;

wherein a second semiconductor die comprises a third conduction terminal arranged on the same side as said second conduction terminal, said second conduction terminal being arranged in contact with said at least one first intermediate frame and said third conduction terminal being arranged in contact with said second intermediate frame;

wherein said first and second intermediate frames respectively have a flat portion, a second S-shaped portion and a flat free end being adjacent to each other;

wherein said flat free ends of said first and second intermediate frames are coplanar to each other; and wherein said metal frame comprises a flat portion, with substantially rectangular plan, and two curved gull-wing-shaped portions, rising on parallel sides of said flat portion and on the same side as a plane Q defined by said flat portion, said curved gull-wing-shaped portions having respective flat free ends being coplanar to said flat free ends of said first and second intermediate frames.

2. A vertical conduction power electronic device package according to claim 1 wherein said curved gull-wing-shaped portions of said metal frame shift upwards near said flat portion with respect to said plane Q defining inside said metal frame respective first steps.

3. A vertical conduction power electronic device package according to claim 1 wherein said curved gull-wing-shaped portions of said metal frame shift upwards near said flat portion with respect to said plane Q defining outside said metal frame respective second steps.

4. A vertical conduction power electronic device package according to claim 1 wherein said flat free ends of said metal frame shift upwards near said curved gull-wing-shaped portions with respect to said plane Q defining inside said metal frame respective third steps.

5. A vertical conduction power electronic device package according to claim 1 wherein said flat free ends of said metal frame shift upwards near said curved gull-wing-shaped portions with respect to said plane Q defining outside said metal frame respective fourth steps.

6. A vertical conduction power electronic device package according to claim 1 wherein said flat free end of said first and second intermediate frame shifts near a connection point to said second S-shaped portion in the opposite direction with respect to said first flat portion, being suitable to define respective first steps.

7. A vertical conduction power electronic device package according to claim 1 wherein said flat free end of said first and second intermediate frame shifts near a connection point to said second S-shaped portion, in the opposite direction with respect to said first flat portion, being suitable to define respective second steps.

8. A vertical conduction power electronic device package according to claim 1 wherein said first flat portion of said first and second intermediate frames has near a connection point to said second S-shaped portion respective narrowings.

9. A vertical conduction power electronic device package according to claim 1 wherein said flat portion of said metal frame comprises a non conductive area to electrically split a first and a second portion of said metal frame, said first and second portions comprising each a first and a second flat free end portion, said non conductive area being arranged crosswise to said flat free end portions.

10. A vertical conduction power electronic device package according to claim 1 wherein at least one part of said flat portion of said metal frame has a projection extending on the opposite side with respect to said curved gull-wing-shaped portions.

11. A vertical conduction power electronic device package according to claim 1 wherein said curved gull-wing-shaped portions of said metal frame and/or said flat free ends of said respectively first and second intermediate frames have one or more holes to allow a better adhesion with a resin.

12. A vertical conduction power electronic device package according to claim 1 wherein the vertical conduction power electronic device package further comprises a coating resin of said metal frame, said resin leaving at least one portion of said metal frame exposed.

13. A vertical conduction power electronic device package, comprising:
a conductive frame adapted to house a first semiconductor die having at least first and second conduction terminals on respective opposite sides of the first semiconductor die, the first conduction terminal being adapted to contact the conductive frame;
at least one intermediate conductive frame, each intermediate conductive frame being adapted to contact a corresponding conduction terminal of the first semiconductor die;
wherein each of the intermediate conductive frames is further adapted to contact a corresponding conduction terminal of a second semiconductor die, each intermediate conductive frame being adapted to contact the corresponding conduction terminal of the second semiconductor die on a side that is opposite a side at which the intermediate conductive frame contacts the corresponding conduction terminal of the first semiconductor die;
wherein each of the intermediate conductive frames has a flat portion with a second S-shaped portion and a flat free end being adjacent to each other; and
wherein the flat free ends of first and second intermediate conductive frames are coplanar to each other.

14. A vertical conduction power electronic device package, comprising:
a first semiconductor die having at least first and second conduction terminals on opposite sides of the first semiconductor die;
a conductive frame coupled to the first semiconductor die to contact the first conduction terminal of the first semiconductor die;
at least one intermediate conductive frame, each intermediate conductive frame contacting a corresponding conduction terminal of the first semiconductor die; and
a second semiconductor die having at least first and second conduction terminals on opposite sides of the second semiconductor die, each of the intermediate conductive frames contacting a corresponding conduction terminal of the second semiconductor die on a side that is opposite a side at which the frame contacts the corresponding conduction terminal of the first semiconductor die;
wherein each of the intermediate conductive frames has a flat portion with a second S-shaped portion and a flat free end being adjacent to each other; and
wherein the flat free ends of first and second intermediate conductive frames are coplanar to each other.

15. The vertical conduction power electronic device package of claim 14 wherein an electronic device selected from one of a MOS power device, IGBT, MCT, BJT, JFET, junction diode, or Schottky diode is formed in the first semiconductor die.

16. The vertical conduction power electronic device package of claim 15 wherein an electronic device selected from one of a MOS power device, IGBT, MCT, BJT, JFET, junction diode, or Schottky diode is formed in the second semiconductor die.

17. An electronic system, comprising:
an electronic subsystem, the electronic subsystem including a vertical conduction power electronic device package, the vertical conduction power electronic device package including,
a first semiconductor die having at least first and second conduction terminals on opposite sides of the first semiconductor die;
a conductive frame coupled to the first semiconductor die to contact the first conduction terminal of the first semiconductor die;
at least one intermediate conductive frame, each intermediate conductive frame contacting a corresponding conduction terminal of the first semiconductor die; and
a second semiconductor die having at least first and second conduction terminals on opposite sides of the second semiconductor die, each of the intermediate conductive frames contacting a corresponding conduction terminal of the second semiconductor die on a side that is opposite a side at which the frame contacts the corresponding conduction terminal of the first semiconductor die;
wherein each of the intermediate conductive frames has a flat portion with a second S-shaped portion and a flat free end being adjacent to each other; and
wherein the flat free ends of first and second intermediate conductive frames are coplanar to each other.

18. The electronic system of claim 17 wherein the electronic subsystem comprises a mobile device.

19. The electronic system of claim 18 wherein the mobile device comprises a laptop personal computer.

20. The electronic system of claim 18 wherein the mobile device comprises a cellular phone.

* * * * *